US011131007B1

(12) United States Patent
Agarwal et al.

(10) Patent No.: US 11,131,007 B1
(45) Date of Patent: Sep. 28, 2021

(54) BORON NITRIDE NANOTUBE-MAGNESIUM ALLOY COMPOSITES AND MANUFACTURING METHODS THEREOF

(71) Applicants: Arvind Agarwal, Miami, FL (US); Pranjal Nautiyal, Miami, FL (US); Benjamin Peter Boesl, Miami, FL (US)

(72) Inventors: Arvind Agarwal, Miami, FL (US); Pranjal Nautiyal, Miami, FL (US); Benjamin Peter Boesl, Miami, FL (US)

(73) Assignee: THE FLORIDA INTERNATIONAL UNIVERSITY BOARD OF TRUSTEES, Miami, FL (US)

( * ) Notice: Subject to any disclaimer, the term of this patent is extended or adjusted under 35 U.S.C. 154(b) by 0 days.

(21) Appl. No.: 17/177,663

(22) Filed: Feb. 17, 2021

Related U.S. Application Data

(62) Division of application No. 16/916,195, filed on Jun. 30, 2020, now Pat. No. 10,947,607.

(51) Int. Cl.
| | |
|---|---|
| *C22C 1/05* | (2006.01) |
| *C23C 14/18* | (2006.01) |
| *C22C 23/00* | (2006.01) |
| *C22C 1/04* | (2006.01) |
| *C23C 14/34* | (2006.01) |
| *C23C 14/58* | (2006.01) |

(52) U.S. Cl.
CPC ............. *C22C 1/05* (2013.01); *C22C 1/0408* (2013.01); *C22C 23/00* (2013.01); *C23C 14/185* (2013.01); *C23C 14/34* (2013.01); *C23C 14/5806* (2013.01)

(58) Field of Classification Search
CPC ......... C22C 1/05; C22C 1/0408; C22C 23/00; C23C 14/5806; C23C 14/185; C23C 14/34
See application file for complete search history.

(56) References Cited

U.S. PATENT DOCUMENTS

| | | | |
|---|---|---|---|
| 8,206,674 | B2 | 6/2012 | Smith et al. |
| 9,059,361 | B1 | 6/2015 | Legg et al. |
| 2009/0081408 | A1 | 3/2009 | Chan |
| 2017/0268088 | A1* | 9/2017 | Sherman ............... C22C 26/00 |

(Continued)

FOREIGN PATENT DOCUMENTS

| | | |
|---|---|---|
| CN | 103710599 | 4/2014 |
| CN | 104233033 | 12/2014 |
| CN | 105256208 | 1/2016 |

OTHER PUBLICATIONS

Sunil K. Singhal et al., Fabrication of Al-Matrix Composites Reinforced with Amino Functionalized Boron Nitride Nanotubes, Journal of Nanoscience andNanotechnology, vol. 11, 5179-5186, 2011.

(Continued)

*Primary Examiner* — John A Hevey
(74) *Attorney, Agent, or Firm* — Saliwanchik, Lloyd & Eisenschenk

(57) ABSTRACT

Boron nitride nanotube (BNNT)-magnesium (Mg) alloy composites and methods of fabricating the same are provided. The BNNT-Mg alloy composites can have a sandwich structure and can be fabricated by high-pressure spark plasma sintering. A mat of BNNTs can be sputter-coated with Mg, and then sandwiched between Mg alloy particles, followed by a sintering step. The BNNTs can include a hexagonal boron nitride phase.

20 Claims, 15 Drawing Sheets

(56) References Cited

U.S. PATENT DOCUMENTS

2017/0355021 A1* 12/2017 Agarwal ................ C22C 47/04
2019/0376169 A1   12/2019 Okai

OTHER PUBLICATIONS

Maho Yamaguchi et al., Synthesis, structural analysis and in situ transmission electron microscopy mechanical tests on individual aluminum matrix/boron nitride nanotube nanohybrids, Acta Materialia 60 (2012) 6213-6222.

Debrupa Lahiri et al., Insight into reactions and interface between boron nitride nanotube and aluminum, J. Mater. Res., vol. 27, No. 21, Nov. 14, 2012.

Debrupa Lahiri et al., Boron nitride nanotubes reinforced aluminum composites prepared by spark plasma sintering: Microstructure,mechanical properties and deformation behavior, Materials Science & Engineering A 574 (2013) 149-156.

Maho Yamaguchi et al., Utilization of multiwalled boron nitride nanotubes for the reinforcement of lightweight aluminum ribbons, Nanoscale Research Letters 2013, 8:3.

Maho Yamaguchi et al., Powdermetallurgyroutestowardaluminumboronnitridenanotube composites, theirmorphologies, structures and mechanicalproperties, Materials Science & Engineering A 604 (2014) 9-17.

Yanming Xue et al., Aluminum matrix composites reinforced with multi-walled boron nitride nanotubes fabricated by a high-pressure torsion technique, Materials and Design 88 (2015) 451-460.

Pranjal Nautiyal et al., Oxidative Unzipping and Transformation of High Aspect Ratio Boron Nitride Nanotubes into "White Graphene Oxide" Platelets, Scientific Reports, www.nature.com/scientificreports, Jul. 8, 2016.

Pranjal Nautiyal et al., Reactive wetting and filling of boron nitride nanotubes by molten aluminum during equilibrium solidification, Acta Materialia 126 (2017) 124-131.

Pranjal Nautiyal et al., Non-equilibrium wetting and capture of boron nitride nanotubes in molten aluminum during plasma spray, Scripta Materialia 151 (2018) 71-75.

Melania Antillon et al., Strengthening in Boron Nitride Nanotube Reinforced Aluminum Composites Prepared by Roll Bonding, Advanced Engineering Materials, www.aem-journal.com, 2018, 1800122.

Konopatsky et al., High-Strength Aluminum-based Composite Materials Reinforced by Microstructures and Nanostructures (Mini Review), 2019, Russian Journal of Non-Ferrous Metals, vol. 60, No. 6, pp. 720-729.

* cited by examiner

BORON NITRIDE NANOTUBE-MAGNESIUM ALLOY COMPOSITES AND MANUFACTURING METHODS THEREOF

CROSS-REFERENCE TO RELATED APPLICATION

The present application is a divisional application of U.S. application Ser. No. 16/916,195, filed Jun. 30, 2020, the disclosure of which is hereby incorporated by reference in its entirety, including all figures, tables, and drawings.

BACKGROUND

Magnesium (Mg) alloys are the lightest structural alloys, with a density of 1.74 grams per cubic centimeter (g/cm$^3$), and have been increasingly employed for aerospace and automotive applications to achieve superior energy efficiency and reduced carbon footprint. However, the stiffness, hardness, strength, and creep-resistance of commercial Mg alloys do not measure up for critical load-bearing applications where steel, titanium, or high-strength aluminum alloys are used. Another major challenge with Mg alloys is their low ductility because they have only one close-packed plane (basal plane), and slip is primarily confined to this plane at room temperature. The problem of limited ductility would only be further exacerbated by adding secondary fillers, which can decrease the ductility even more.

BRIEF SUMMARY

Embodiments of the subject invention provide novel and advantageous boron nitride nanotube (BNNT)-magnesium (Mg) alloy composites and methods of fabricating the same. The BNNT-Mg alloy composites have crack-bridging ability and can be fabricated by, for example, high-pressure spark plasma sintering. The composite is lightweight, and the BNNT includes a hexagonal boron nitride (h-BN) phase. A mat of BNNT can be sputter-coated with Mg, and then sandwiched between Mg alloy (e.g., Mg alloy powder) particles. This can be followed by a sintering step, where high pressure and/or an electric field is applied to consolidate the Mg alloy and the BNNTs. The processing temperature and pressure during sintering can be chosen to promote strong bonding and controlled chemical reactions at the alloy-BNNT interface.

In an embodiment, a method of fabricating a BNNT-Mg alloy composite can comprise: providing a mat of BNNTs; sputter-coating the mat of BNNTs with Mg to give a sputter-coated mat; sandwiching the sputter-coated mat between layers of an Mg alloy; and sintering the sputter-coated mat and the Mg alloy to give the BNNT-Mg alloy composite. The BNNTs of the BNNT-Mg alloy composite can have an aspect ratio of at least 3,000 (e.g., 3,000-40,000), and the BNNT-Mg alloy composite can have crack-bridging ability due to the BNNTs of the BNNT-Mg alloy composite resisting crack propagation and crack opening (e.g., because of the high aspect ratio). The crack-bridging ability of the BNNT-Mg alloy composite can be further due to strong bonding between the BNNTs of the BNNT-Mg alloy composite and the Mg alloy of the BNNT-Mg alloy composite, and the strong bonding between the BNNTs of the BNNT-Mg alloy composite and the Mg alloy of the BNNT-Mg alloy composite can be due to the sputter-coating of the mat and/or due to interfacial reactions between the BNNTs of the BNNT-Mg alloy composite and the Mg alloy of the BNNT-Mg alloy composite. The sintering can be spark plasma sintering (SPS), such as high pressure SPS performed at a pressure of at least 400 megaPascal (MPa). The high pressure SPS can be performed at a temperature of at least 400° C. and for a time period of at least 10 minutes. The layers of the Mg alloy can comprise powder of the Mg alloy. The Mg alloy can comprise Mg and, for example, aluminum (Al) and/or and zinc (Zn). The Mg alloy can be, for example, AZ31. The mat of BNNTs can comprise a porosity of at least 75%, and the BNNTs of the mat of BNNTs can have a diameter in a range of from 5 nanometers (nm) to 15 nm (e.g., about 10 nm) and a length of at least 50 micrometers (µall) (e.g., at least 75 µm or in a range of 75-200 µm). The sputter-coated mat can comprise a layer of Mg on both an upper surface and a lower surface thereof, each layer of Mg having a thickness of at least (or about) 1 µm and a purity of Mg of at least 99.9% (e.g., at least 99.99%). The BNNT-Mg alloy composite can comprise BNNT in a range of from 0.5 wt % to 5 wt % (e.g., 1 wt % or about 1 wt %). The BNNT-Mg alloy composite can comprise: a nano-phase of magnesium nitride ($Mg_3N_2$) and a nano-phase of metal nitride (e.g., AlN) between the Mg alloy and the BNNTs; and an h-BN phase in the BNNTs.

In another embodiment, a BNNT-Mg alloy composite can comprise: a first layer of an Mg alloy, the Mg alloy comprising Mg and a first metal; a second layer of the Mg alloy; a plurality of BNNTs sandwiched between the first layer and the second layer; and a nano-phase of magnesium nitride ($Mg_3N_2$) and a nano-phase of a nitride of the first metal between the Mg alloy and the BNNTs. The BNNTs can have an aspect ratio of at least 3,000 (e.g., 3,000-40,000), and the BNNT-Mg alloy composite can have crack-bridging ability due to the BNNTs resisting crack propagation and crack opening (e.g., because of the high aspect ratio). The crack-bridging ability of the BNNT-Mg alloy composite can be further due to strong bonding between the BNNTs and the Mg alloy, and the strong bonding between the BNNTs and the Mg alloy can be due to sputter-coating of a mat of BNNTs during fabrication and/or due to interfacial reactions between the BNNTs and the Mg alloy. The layers of the Mg alloy can comprise powder of the Mg alloy. The first metal can be aluminum, and the Mg alloy can further comprise other materials (e.g., zinc (Zn)). The Mg alloy can be, for example, AZ31. The BNNTs can have a diameter in a range of from 5 nm to 15 nm (e.g., about 10 nm) and a length of at least 50 µm (e.g., at least 75 µm or in a range of 75-200 µm). The BNNT-Mg alloy composite can comprise the BNNTs in a range of from 0.5 wt % to 5 wt % (e.g., 1 wt % or about 1 wt %). The composite can further comprise an h-BN phase in the BNNTs.

DETAILED DESCRIPTION

Figure 1:
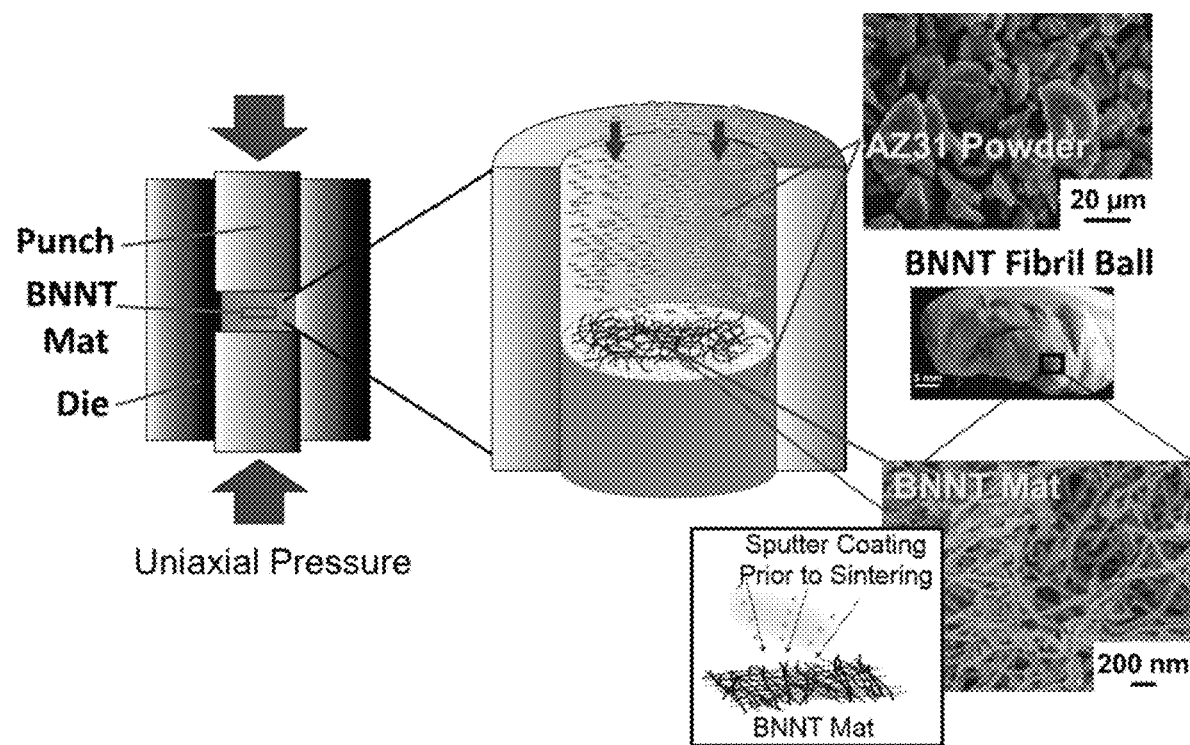
FIG. 1 is a schematic view of a processing scheme for a magnesium alloy (AZ31) and boron nitride nanotube (BNNT) composite by high-pressure spark plasma sintering, according to an embodiment of the subject invention.

Embodiments of the subject invention provide novel and advantageous boron nitride nanotube (BNNT)-magnesium (Mg) alloy composites and methods of fabricating the same. The BNNT-Mg alloy composites have crack-bridging ability and can be fabricated by, for example, high-pressure spark plasma sintering. The composite is lightweight, and the BNNT includes a hexagonal boron nitride (h-BN) phase. A mat of BNNT can be sputter-coated with Mg, and then sandwiched between Mg alloy (e.g., AZ31) powder particles. This can be followed by a sintering step, where high pressure and/or an electric field is applied to consolidate the Mg alloy powders and the BNNT mat. The processing temperature and pressure during sintering can be chosen to promote strong bonding and controlled chemical reactions at the alloy-BNNT interface. The composite material can include nano-phases of magnesium nitride ($Mg_3N_2$) and aluminum nitride (AlN) formed between the Mg alloy and BNNT. These nano-phases can act as covalently bonded anchors between the Mg alloy and BNNT. The strong interface bonding is critical for load-transfer between the Mg alloy matrix and the BNNT filler. A double cantilever test inside a scanning electron microscope (SEM) was performed to confirm this, and the BNNT was seen to bridge, resist, and delay crack propagation in the composite due to a strong bonding between the nanotubes and the matrix. Any Mg alloy can be used with embodiments of the subject invention.

When the term "about" is used herein before a numerical value, it is understood that the value can be +/−5% of the stated value. For example, "about 10 kg" is 9.5 kg-10.5 kg.

The BNNTs can help augment the load-bearing capability of Mg alloys, which are the lightest structural metallic materials and are therefore a good choice for aerospace and automotive applications. The stiffness and strength of Mg alloys on their own are not at par with other commercial structural alloys of aluminum (Al), titanium (Ti), or iron (Fe). Thus, embodiments of the subject invention exploit the excellent mechanical properties of BNNTs, which have a strength of about 30 gigaPascals (GPa) and an elastic modulus of about 1 teraPascal (TPa), for reinforcing magnesium matrices. BNNTs are also thermally stable up to about 900° C. or even 1000° C. or more, which is much greater than the melting temperature of magnesium (about 660° C.). This makes BNNT an excellent option for incorporating in Mg alloys (e.g., Mg—Al alloys, such as AZ31, which is a known Mg—Al alloy).

The incorporation of strong filler materials (e.g., particles, fibers, whiskers, or platelets) may be helpful to augment the mechanical properties of Mg alloys. BNNT, a one-dimensional nanomaterial and a structural analog of a carbon nanotube (CNT), is a good structural filler for lightweight metals because of its high strength and elastic modulus. Unlike CNT, BNNT has superior thermal stability as it can withstand much higher temperatures (>900° C.) without oxidizing or structurally degrading. This provides a wider processing window for manufacturing metal matrix composites (MMCs), which often require elevated temperatures. BNNT is also known to be chemically more inert than CNT, making it a favorable filler material to avoid excessive reactions during MMC processing. The addition of BNNT to metal matrices improves their tensile strength, compressive strength, elastic modulus, hardness, and high-temperature strength.

The problem of limited ductility in Mg alloys would be expected to be further exacerbated by adding secondary fillers, which may increase strength and stiffness but at the cost of ductility. This necessitates a careful composite design and processing to enhance the load-bearing capability of Mg alloys without compromising their plasticity. If the nanofillers are distributed throughout the metal matrix, they may obstruct dislocation motion and can cause a build-up of dislocation forests, thereby hampering the plasticity of the metal. Therefore, embodiments of the subject invention can employ a sandwich design approach, where the composite includes a matrix/filler multi-layer architecture, thereby minimizing the obstruction of dislocation motion and increasing ductility. While the dislocation activity may not be severely restricted in the metallic layers, the intermediate reinforcement layer can provide superior resistance to failure. A sandwich architecture is also good for aerospace composites due to ease of scaling up.

In an embodiment, a sandwich-structured composite of a magnesium alloy and BNNT can be fabricated using a powder metallurgy route. The magnesium alloy can be, for example, an Mg—Al alloy such as a Mg—Al-zinc (Zn) alloy. AZ31 is a known Mg alloy that can be used, and it includes 3 weight percent (wt %) Al (or about 3 wt % Al), 1 wt % Zn (or about 1 wt % Zn), and the balance Mg. The processing approach can include Joule heating and high mechanical pressures to synthesize the Mg-BNNT composite. Powder metallurgy is useful for near-net-shape manufacturing of Mg-based composites (e.g., using custom-made dies), considering they have limited formability. The microstructure evolution and nanoscale physical-chemical interactions between the alloy and the nanotubes can be examined, and in fact, in-situ high-resolution mechanical characterization has been performed to probe the strengthening mechanisms due to BNNT.

Embodiments of the subject invention provide highly effective ways of improving the load-bearing capability of lightweight Mg alloys. Long BNNTs are used to impart crack-bridging ability and superior failure-resistance in the composite material. Such crack arrest mechanisms are otherwise absent in Mg alloys. Also, while adding a secondary filler (e.g., nanotubes) might be expected to further lower the ductility of Mg alloys because the filler phase may tend to obstruct dislocation motion in the matrix, embodiments of the subject invention can use a sandwich-structured composite such that the BNNTs are not dispersed throughout the metal matrix but instead incorporated in a layered fashion. This improves the ductility of the composite and advantageously does not lower the ductility of the Mg alloy as would be expected. The BNNTs included in the composites can have a very high aspect ratio (e.g., 3,000-40,000), where the aspect ratio is the length divided by the diameter or the length divided by the width (e.g., width when viewed from side). The advantageous crack bridging ability of the composites of embodiments of the subject invention is primarily due to the high aspect ratio. The advantageous crack bridging ability is also due to excellent interface bonding afforded by sputter-coating and interfacial reactions.

Magnesium alloys often tend to have limited formability because of limited plasticity, and rolling, forging, or extruding them into desired shapes and forms is challenging. Thus, embodiments of the subject invention can utilize a powder metallurgy (sintering) route, which can be useful for near-net shape manufacturing of composite components by designing dies in a desired shape and/or with desired dimensions.

Some Mg alloys, including AZ31 powders, include native magnesium oxide, which can hinder bonding between the alloy and BNNT. Therefore, embodiments of the subject invention can use a high-pressure sintering strategy, with a high applied pressure (e.g., 400 megaPascal (MPa) or more) to overcome the hindrance to bonding.

Long nanotubes can be utilized to promote effective strengthening. The efficacy of the long nanotubes was proven by conducting in-situ mechanical tests with an SEM. The nanotubes acted as anchors to prevent or inhibit crack opening. Mechanical work had to be expended in breaking the nanotubes, delaying the crack propagation through the composite. This proves the benefit of using long nanotubes for load-bearing composite materials. The crack bridging action is expected to be most successful if the nanotubes are strongly bonded with the magnesium alloy matrix. Weak bonding can result in easy sliding and pull-out of nanotubes without much (or even any) beneficial strengthening. Thus, embodiments of the subject invention can include a sputtering step before sintering. The BNNT mat used in the composite can be sputter coated with Mg. Ballistic bombardment during sputtering results in Mg metal adhering to the BNNT mat. The sputter coated BNNT can be more effectively integrated in the Mg alloy because the alloy powders can easily bond with the Mg coating.

The composite can include magnesium nitride ($Mg_3N_2$) and metal nitride (e.g., aluminum nitride (AlN) when aluminum is present in the alloy) nano-phases formed by reactions between the Mg alloy and BNNT. The formation of these interfacial products helps in reactive bonding between the Mg alloy and BNNT. The newly formed nano-phases act as interface anchors, and this is beneficial for load-bearing and/or stress-transfer ability in structural applications.

High-pressure spark plasma sintering (SPS) can help in rapid consolidation of the material (e.g., in a few minutes). A short hold time of 10 minutes at the sintering temperature (e.g., 400° C.) ensures that the interfacial reactions between the Mg alloy and BNNT are limited and controlled. This is important to prevent or inhibit damage/degradation of the nanotubes. This hold time can also be varied to tweak or control the amount of interfacial products in the composite. Therefore, high-pressure SPS is an effective technique to produce BNNT-magnesium alloy composite microstructures.

A spark plasma sintering (SPS) process can be employed for pressure, and direct current (DC) assisted consolidation. High pressure and local electric discharge (between the alloy powders and the nanotubes) during SPS can promote rapid physical/chemical bonding. The vacuum environment of SPS is also conducive to prevent or inhibit high-temperature oxidation of Mg. BNNT in the form of a porous mat (e.g., about 80% porosity) including fine (e.g., about 5-10 nm in diameter) and long (e.g., length up to 200 μm) nanotubes can be used in the composite. The BNNT mat can be sputter-coated with a deposition of Mg (e.g., 1 μm thick 99.99% pure Mg deposition) on both sides of the mat. The ballistic impact of Mg on the BNNT mat during sputtering is intended to create interfaces conducive to matrix-filler inter-layer bonding during SPS. The sputter-coated BNNT mat can then be sandwiched between Mg alloy layers (e.g., alloy powder layers) in a die. The final consolidated composite pellets can have a weight percentage of, for example, 1 wt % BNNT, and densities of at least 99% (here, density is the opposite of porosity, such that density of at least 99% means at most 1% porosity in the composite). In a specific embodiment, the Mg alloy can be AZ31, and the sputter-coated BNNT mat can be sandwiched between AZ31 powder layers in a tungsten carbide (WC) die. Temperature, pressure, and hold time of 400° C., 400 MPa, and 10 minutes, respectively, can be used for sintering. The final consolidated composite pellets can have a 1 wt % BNNT composition and densities of at least 99%.

The weight percentage (wt %) of BNNT in the final composition can be, for example, any of the following values, about any of the following values, at least any of the following values, or at most any of the following values: 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.5, 4, 4.5, 5, 5.5, 6, 7, 8, 9, or 10.

Intimate bonding between Mg and BNNT is essential to ensure effective mechanical reinforcement. An oxide layer formed on the Mg alloy (powder) particles can be a major impediment to bonding during the sintering of Mg. FIG. 1 is a schematic view of a processing scheme for a Mg alloy-BNNT composite by high-pressure SPS, according to an embodiment of the subject invention. Referring to FIG. 1, an SPS process can be employed for pressure and DC assisted consolidation. High pressure and local electric discharge (between the alloy and the nanotubes) during SPS can promote rapid physical/chemical bonding. The vacuum environment of SPS is also conducive to preventing or inhibiting high-temperature oxidation of Mg. BNNT in the form of a porous mat (e.g., about 80% porosity) including fine (e.g., about 10 nm in diameter or less) and long (e.g., about 75-200 μm or more) nanotubes can be used in the composite. The BNNT mat can be sputter-coated with an Mg deposition on one or both sides thereof. For example, a 1 μm thick 99.99% pure Mg deposition can be provided on both sides. The ballistic impact of Mg on BNNT mat during sputtering can create interfaces conducive to matrix-filler inter-layer bonding during SPS. The sputter-coated BNNT mat can then be sandwiched between Mg alloy (powder) layers (e.g., AZ31 powder layers) in a WC die.

High-pressure SPS is an effective technique to fabricate BNNT-reinforced Mg alloy sandwich composites (see also Examples 1 and 2 below). A combination of high pressures and elevated temperatures during processing allows rapid sintering and bonding of Mg alloy and BNNT. Limited interfacial reactions are helpful for effective stress-transfer between the matrix and the nanotubes. Crack-bridging can occur due to BNNT in the sandwich-structured composite, providing superior failure-resistance. BNNT is a highly effective reinforcement material for augmenting the mechanical properties of lightweight magnesium and magnesium alloys. The composites and manufacturing methods of embodiments of the subject invention have many applications, including but not limited to aerospace and automotive applications.

Embodiments of the subject invention provide composites with improved properties (e.g., one or more of tensile strength, hardness, and wear resistance (see also Examples 1 and 2)). High pressure SPS solid state sintering can be used for fabrication, and an Mg alloy including Al and/or Zn can be used. Interfacial reaction anchors can be used, and the final composition can include Mg—Al—Zn—BN—$Mg_3N_2$—AlN. The composite can be a layered (e.g., sandwich-style) composite, with Mg alloy-BNNT-Mg alloy (e.g., AZ31/BNNT/AZ31) layers.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to the invention.

Example 1

The setup shown in FIG. 1 was used to fabricate an Mg alloy-BNNT composite using an SPS process. BNNT in the form of a porous mat (about 80% porosity) of fine (about 10 nm in diameter) and long (up to 200 μm) nanotubes (BNNT, LLC, Newport News, Va., USA) was used in the composite. The BNNT mat was sputter-coated with a 1 μm thick 99.99% pure Mg deposition on both sides thereof. The sputter-coated BNNT mat was then sandwiched between AZ31 powder layers (Elektron-21, -325 mesh, Magnesium Elektron, Manchester, N.J., USA) in a WC die. Temperature, pressure and hold time of 400° C., 400 MPa, and 10 minutes, respectively, were used for sintering (Model 10-4, Thermal Technologies, Santa Rosa, USA). High pressure was applied to ensure good bonding between AZ31 and BNNTs. The final consolidated pellets had 1 wt % BNNT composition and densities exceeding 99%.

Figure 2A:
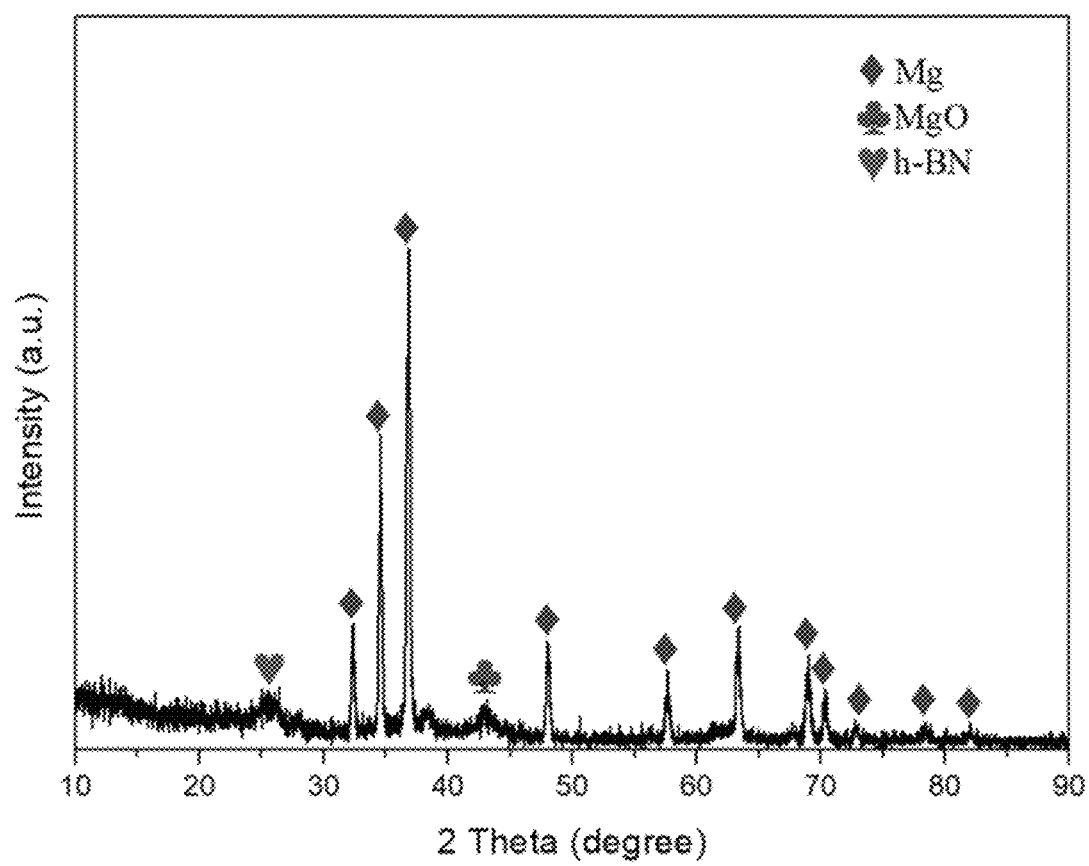
FIG. 2(a) is an X-ray diffraction (XRD) plot showing hexagonal boron nitride (h-BN, designated with hearts), Mg (designated with diamonds), and MgO (designated with clubs) in a sintered pellet.

X-ray diffraction (XRD) characterization (Siemens D-5000 X-ray diffractometer, Munich, Germany) was performed and confirmed the retention of the h-BN phase after sintering, indicating the nanotubes did not undergo significant phase transformation during processing. FIG. 2(a) is the XRD plot showing h-BN (h-BN, designated with hearts), Mg (designated with diamonds), and MgO (designated with clubs) peaks in the sintered pellet. There was a minor peak corresponding to magnesium oxide, which is expected due to the native oxide of the starting powder particles.

Figure 2B:
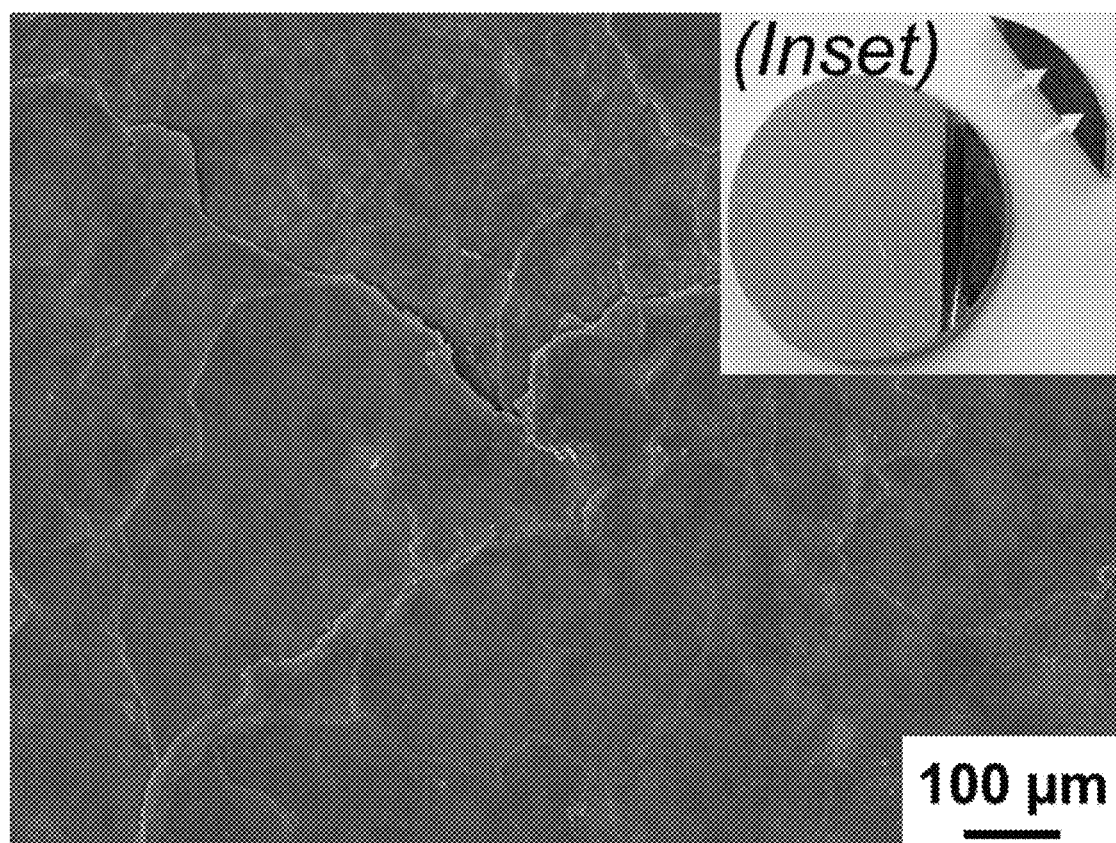
FIG. 2(b) is a low magnification scanning electron microscope (SEM) micrograph showing multiple crack deflection events. The scale bar is 100 micrometers (µm). The inset is an image of the sectioned and delaminated pellet used for imaging.
Figure 2C:
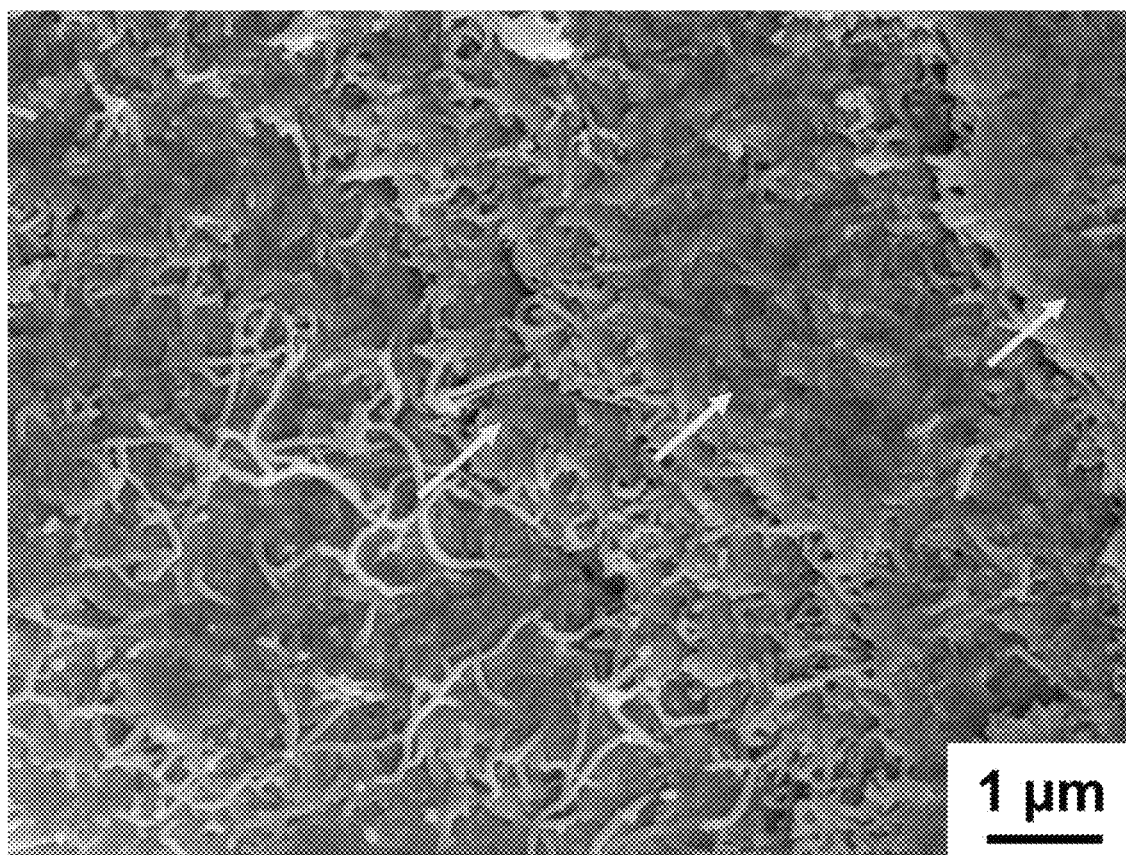
FIG. 2(c) is an SEM micrograph showing a stepped surface and multi-layer cracking due to sectioning. The scale bar is 1 µm.
Figure 2D:
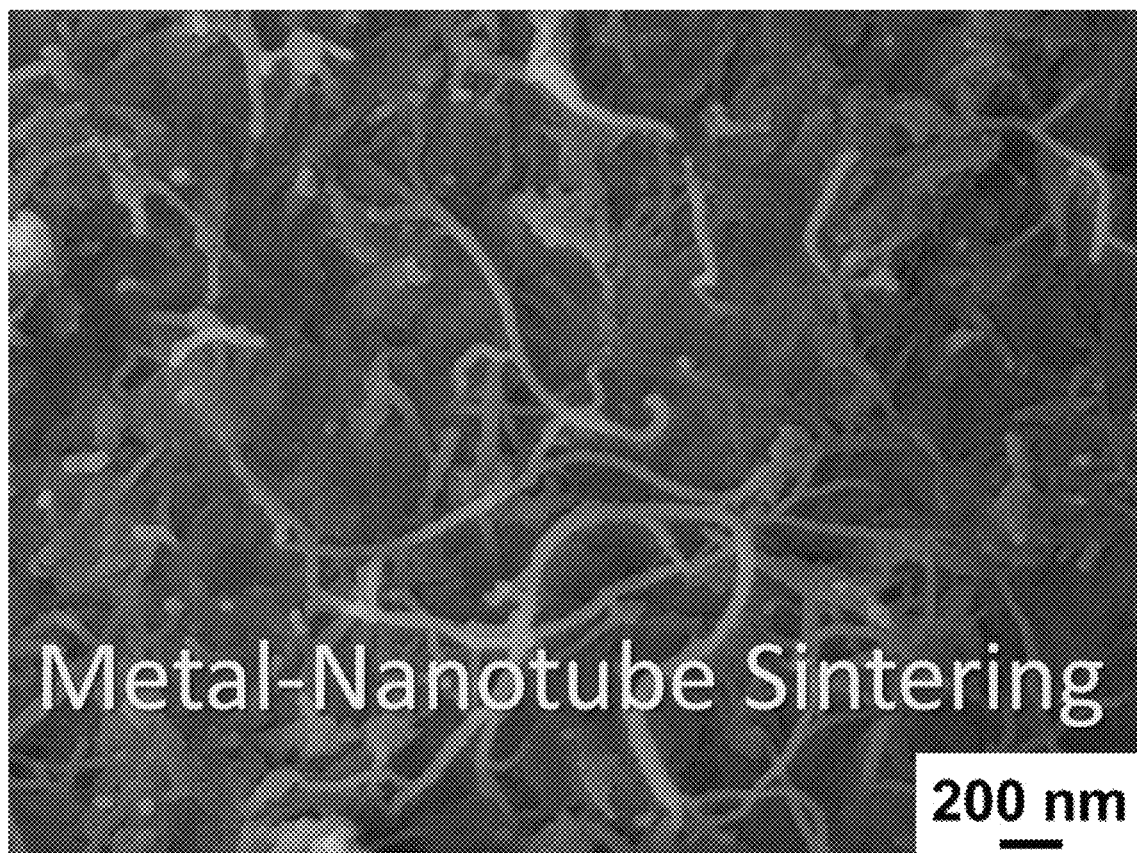
FIG. 2(d) is a high magnification SEM micrograph showing impregnation and intimate bonding of alloy with nanotubes. The scale bar is 200 nanometers (nm).

In order to microscopically evaluate the microstructure and the integration of BNNT in the composite, the sintered pellet was sectioned and delaminated along the sandwiched layer. The sectioning was performed using a slow-speed diamond blade to limit undesirable plastic deformation. The inset in FIG. 2(b) shows the sectioned sample. The exposed interface was then observed under a field emission SEM (JEOL JSM-6330F SEM, Tokyo, Japan). The low magnification image in FIG. 2(b) shows multiple crack deflection events. The delamination was not smooth and a single plane event—instead, there seemed to be a multi-layer detachment. The higher magnification micrograph shown in FIG. 2(c) reveals that a network of nanotubes along the interface prevented or inhibited continuous cracking under cutting forces. This leads to extensive crack deflection, manifesting as a stepped surface post delamination. Strong bonding between BNNT and the metal matrix is important for crack deflection to take place. This is evidenced from the micrograph shown in FIG. 2(d), where the signature of fusion between the alloy powder and the nanotubes is seen. Under the applied pressure during SPS, the powder particles can impregnate into the porous BNNT mat layer. The impregnated particles are then wrapped by the nanotubes during sintering, resulting in a high net contact area for interface bonding. Plastic deformation of the powder particles under the punch pressure aids in intimate alloy/BNNT attachment and the formation of dense nanocomposite clusters at the interface, as shown in FIG. 2(d).

Figure 3A:
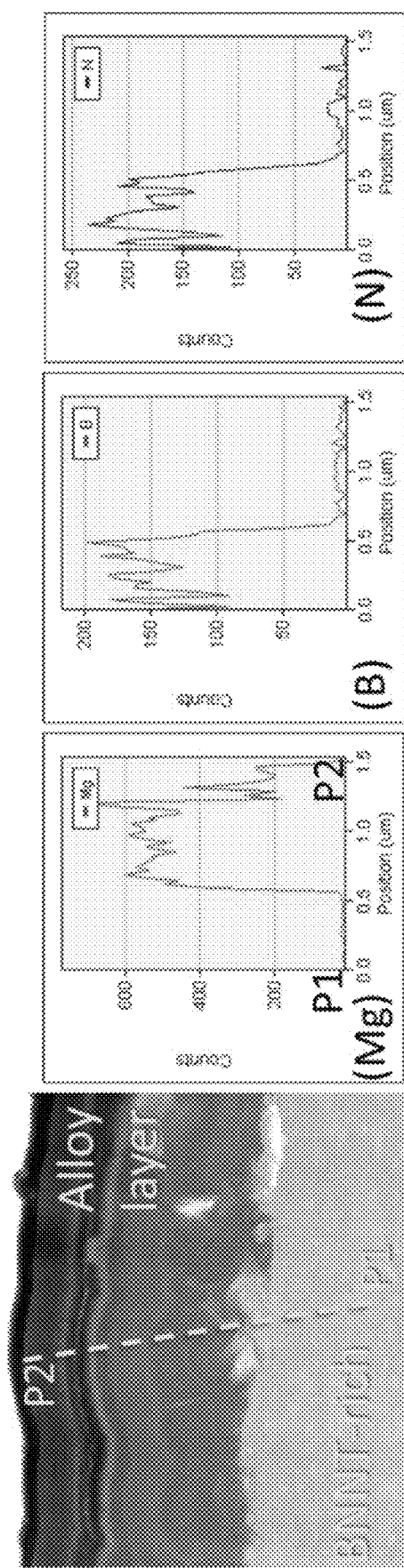
FIG. 3(a) shows scanning transmission electron microscope (STEM) imaging and the corresponding elemental line profile along the alloy-BNNT interface region.
Figure 3B:
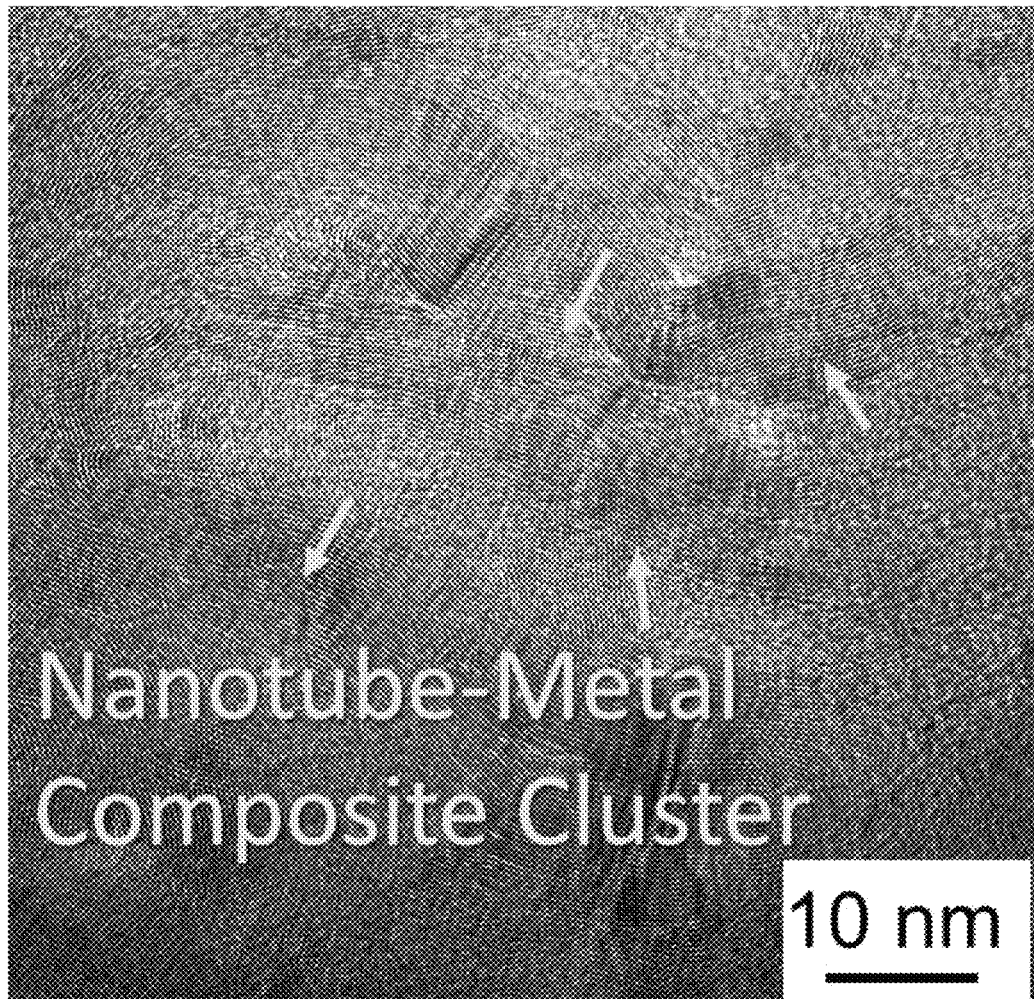
FIG. 3(b) is a high resolution transmission electron microscope (HRTEM) image showing a dense network of BNNTs. The scale bar is 10 nm.
Figure 3C:
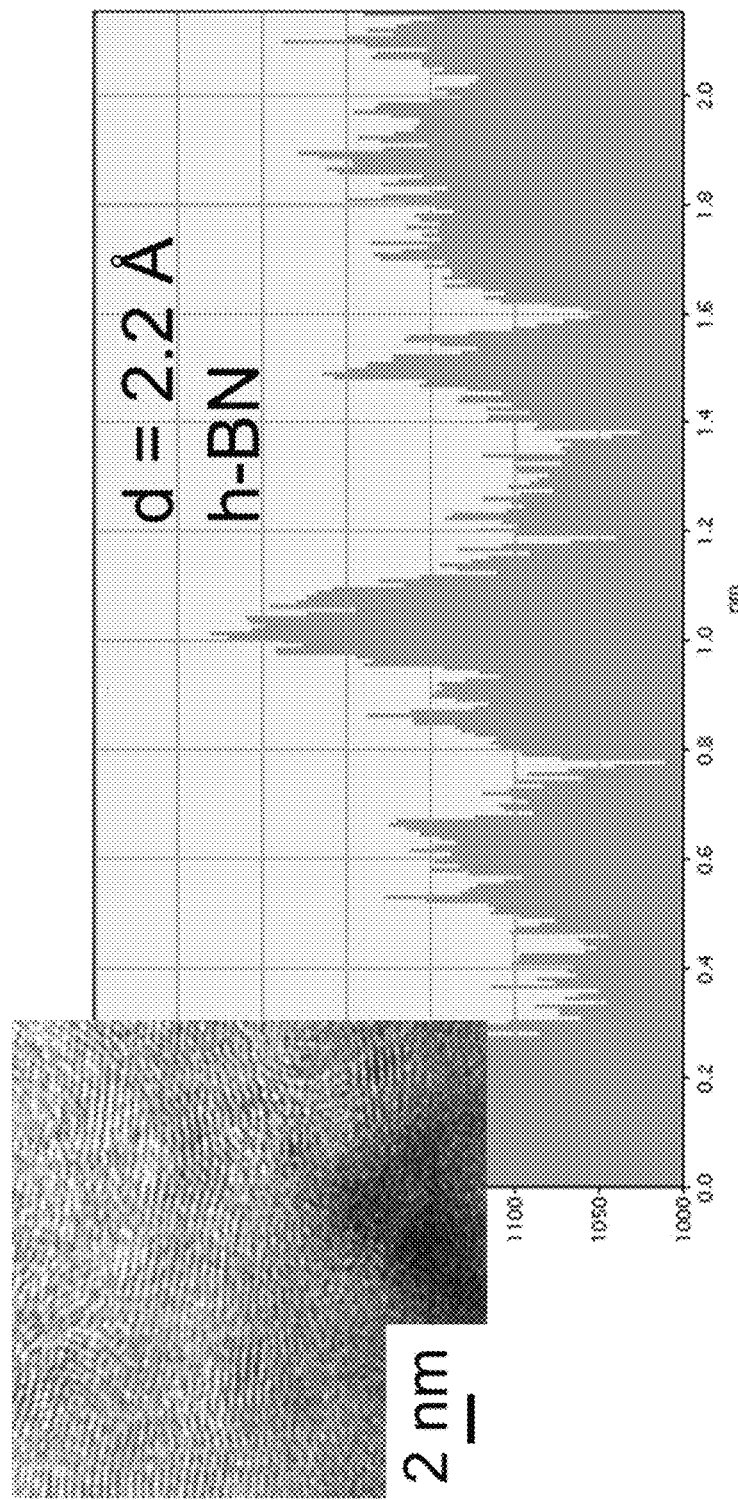
FIG. 3(c) shows d-spacing calculations confirming the h-BN phase of the nanotubes.
Figure 3D:
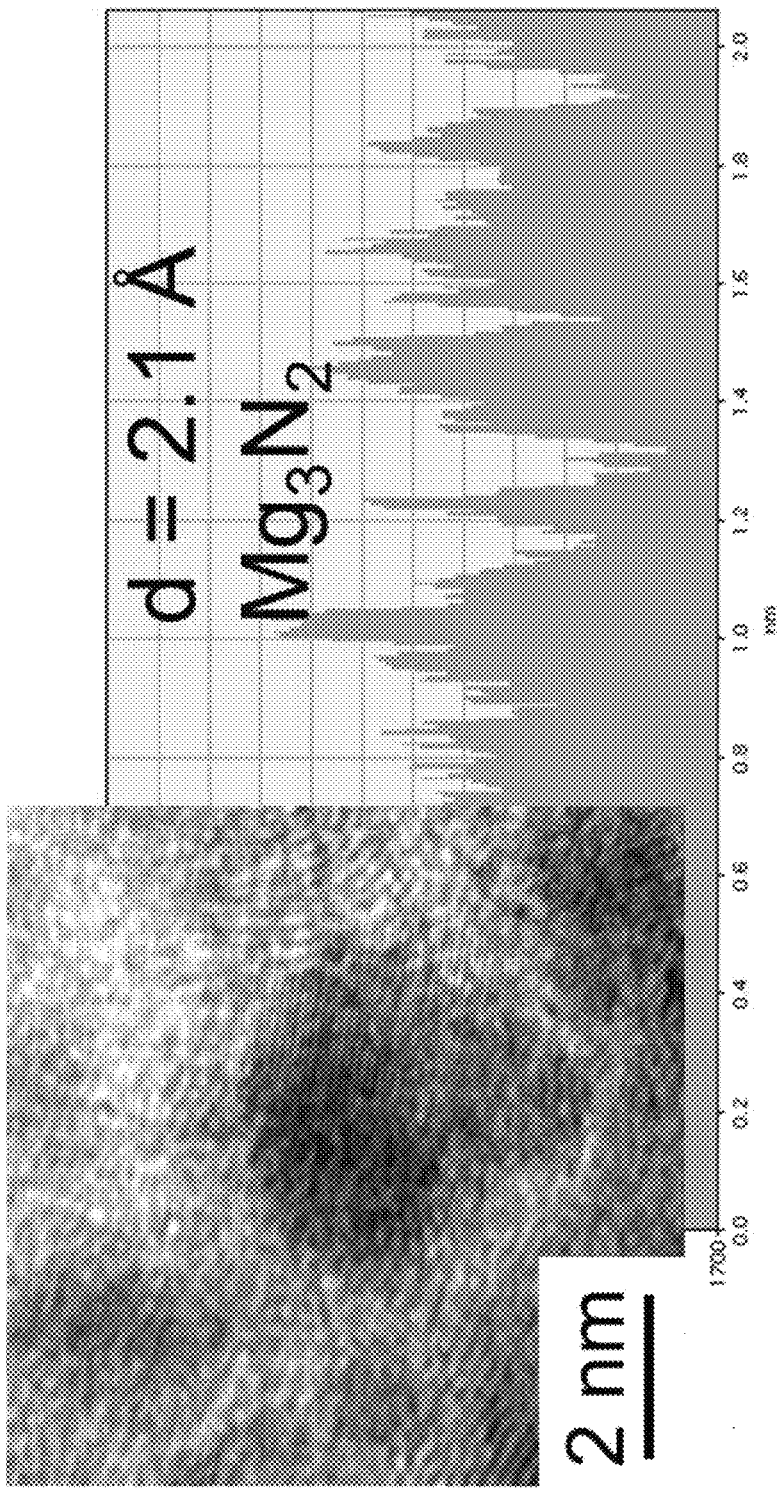
FIG. 3(d) shows d-spacing calculations confirming $Mg_3N_2$ formation.
Figure 3E:
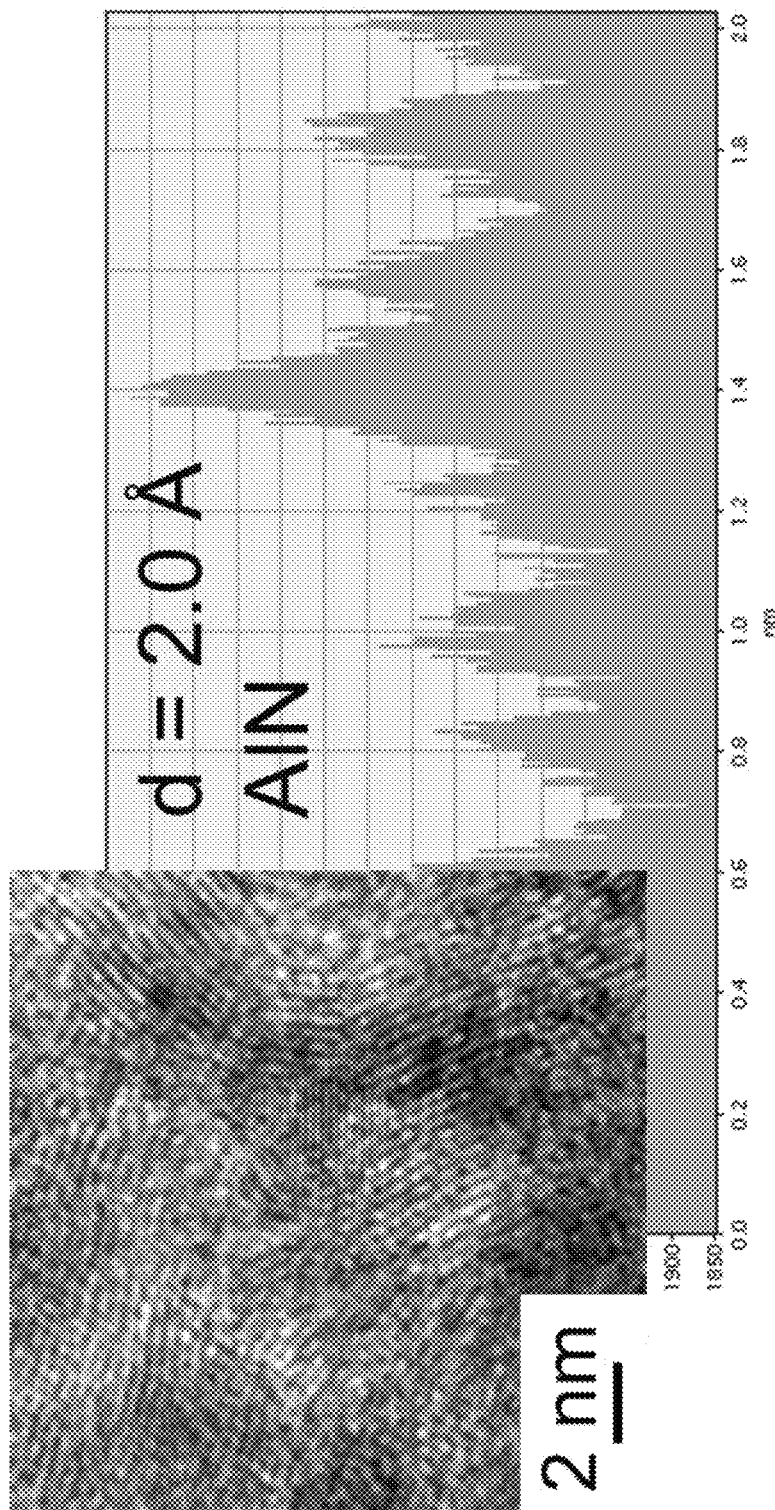
FIG. 3(e) shows d-spacing calculations confirming AlN formation due to AZ31-BNNT reaction.

In addition to the mechanical forces, elevated temperature exposure during SPS promotes thermal diffusion. High-resolution transmission electron microscopy (HRTEM) investigations were performed to interrogate the metal-nanotube interactions. A TEM sample was prepared from the sandwiched interface region by focused ion beam machining (JEOL-JIM 4500). FIG. 3(a) shows a scanning transmission electron microscope (STEM) micrograph of the interface region. An elemental line profile (by energy-dispersive X-ray spectroscopy) demonstrates the transition from a predominantly BNNT-rich region (near "P1") to the Mg alloy layer (around "P2"). The elemental information was then utilized to zoom in and image the interfaces in the BNNT-rich regions. HRTEM imaging shows a dense network of BNNT with a sintered alloy occupying the intertube gaps (FIG. 3(b)). This is indicative of prominent plastic flow or localized extrusion of AZ31 during SPS (400 MPa pressure), enabling effective interface consolidation. Lattice spacing calculations by fast Fourier transform (FFT) analysis confirmed the h-BN phase of the nanotubes (FIG. 3(c)), which establishes that the nanotubes are stable and withstand the processing conditions. HRTEM also revealed a minimal interfacial reaction between the nanotubes and the matrix. FIGS. 3(d) and 3(e) demonstrate the presence of magnesium nitride and aluminum nitride in the composite-clusters, indicating there were some reactions during sintering.

Thermodynamic calculations were performed using the Equilib module of FactSage thermochemical software (see Bale et al., Calphad Comput. Coupling Phase Diagrams Thermochem. 2016, 55, 1; which is hereby incorporated by reference herein in its entirety) to gain insights into the interfacial reactions. The SPS processing temperature and pressure conditions were utilized for the analysis. First, the sandwiched BNNT was expected to react with the thin (1 μm) sputtered coatings of pure Mg (deposited on both sides of the mat). The thermochemical analysis predicted the following reaction based on Gibbs energy minimization:

0.0124 g BN+0.000434 g Mg=0.0122 g BN+0.00045 g $Mg_3N_2$+0.00021 g $MgB_2$, $\Delta G$=−0.123 J      (1)

Subsequently, BNNT interacts with the AZ31 alloy powder in the die, and the following reaction is thermodynamically expected:

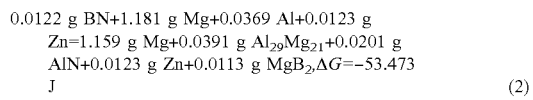

(2)

Negative ΔG confirmed the thermodynamic feasibility of the formation of $Mg_3N_2$ and AlN products observed via TEM (FIGS. 3(d) and 3(e)). These reaction products were not homogeneously observed throughout the nanotube interface, and instead they were scarce and scattered. The reaction kinetics can become a rate-determining step during SPS due to short processing times. This explains why the h-BN phase is retained in the composite (FIGS. 2(a), 3(b), and 3(c)) even though the thermochemical calculations predict the complete consumption of BN (Reaction (2) about). Kinetics constraints are likely responsible for the absence/lack of detection of $MgB_2$ and $Al_{29}Mg_{21}$ phases predicted by FactSage. Controlled reactions are desirable for strong metal/nanotube bonding due to the nano-interphase(s) that act as anchors between the matrix and the filler. The covalently bonded interfaces are intimate, firm, and ideal for matrix-to-filler stress-transfer during mechanical loading[28]. It is noteworthy, though, that excess interfacial reaction is undesirable as that can significantly degrade the morphology and mechanical properties of the nanotubes. Rapid consolidation during SPS is ideal for minimizing high-temperature exposure, and hence the chemical reactions are minimal.

Example 2

Figure 4A:
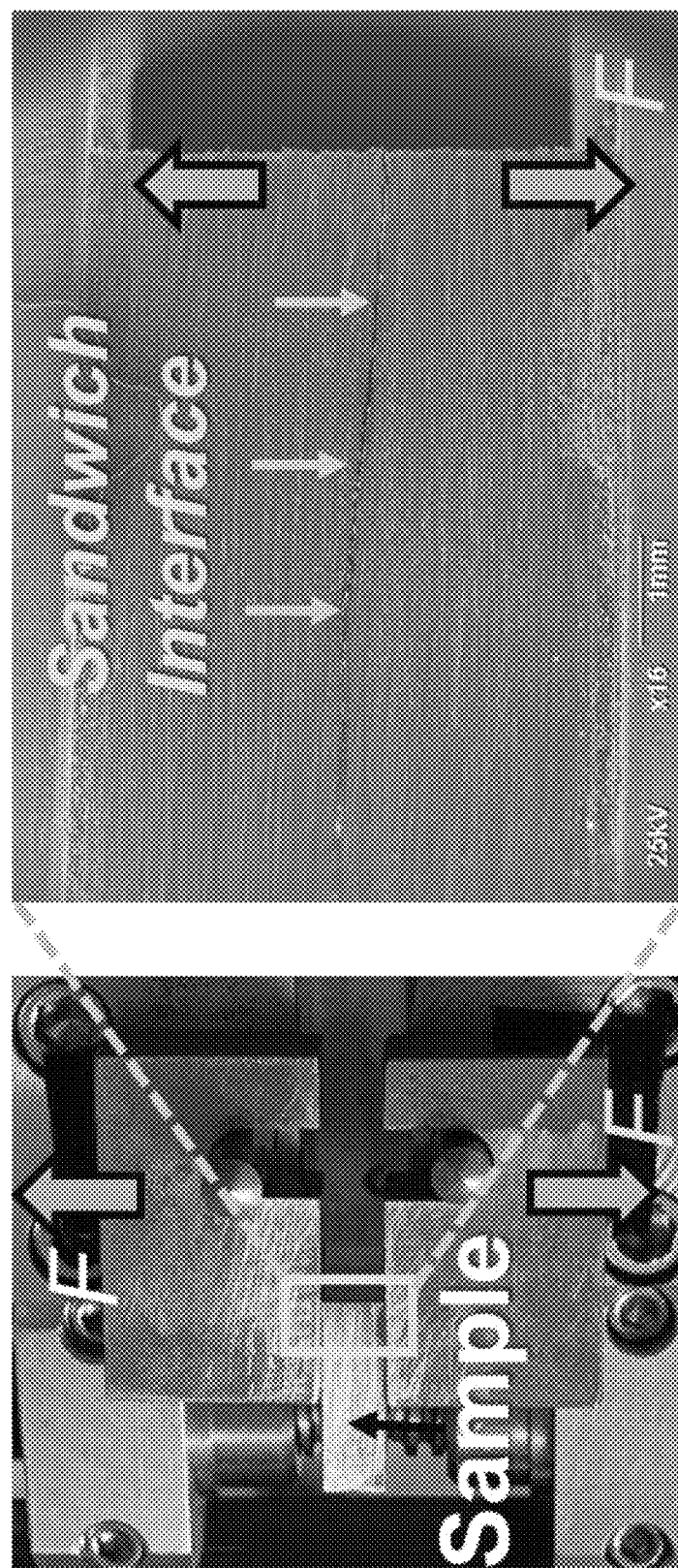
FIG. 4(a) shows a test set-up and SEM image of a sample before loading, for an in-situ double cantilever testing of an AZ31-BNNT composite with real-time SEM imaging, according to an embodiment of the subject invention. The scale bar for the SEM image is 1 millimeter (mm).
Figure 4B:
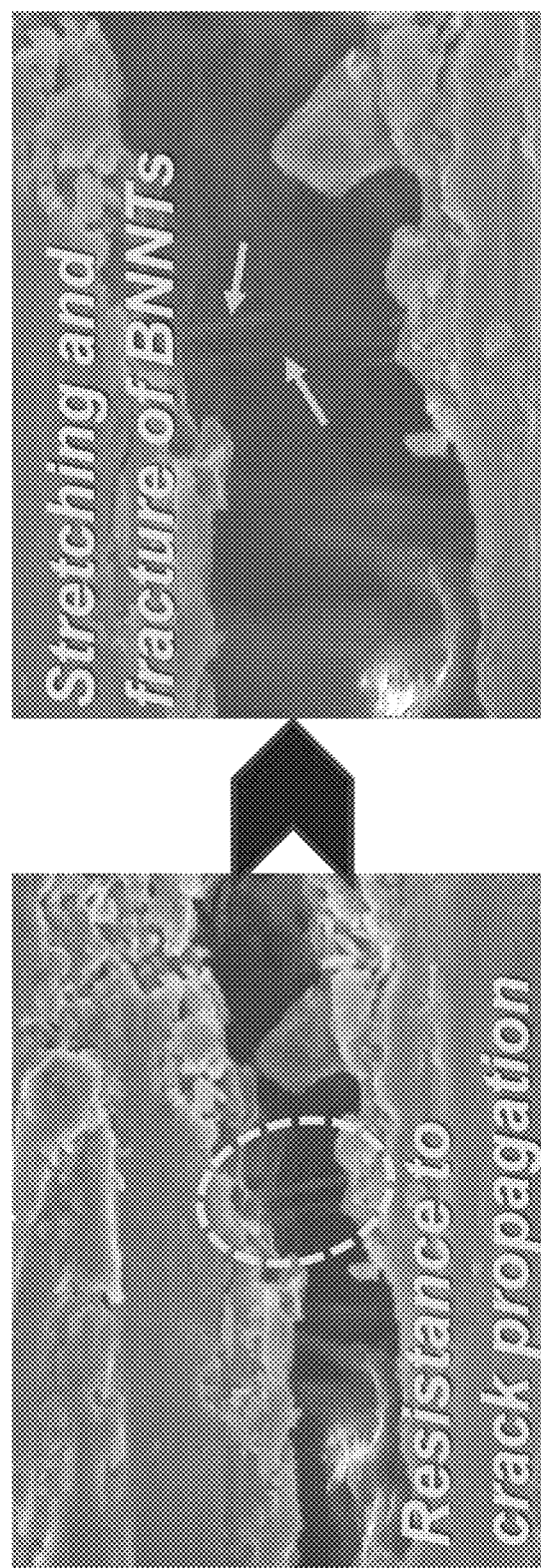
FIG. 4(b) shows SEM images showing stretching and fracture of BNNTs resisting crack opening.
Figure 4C:
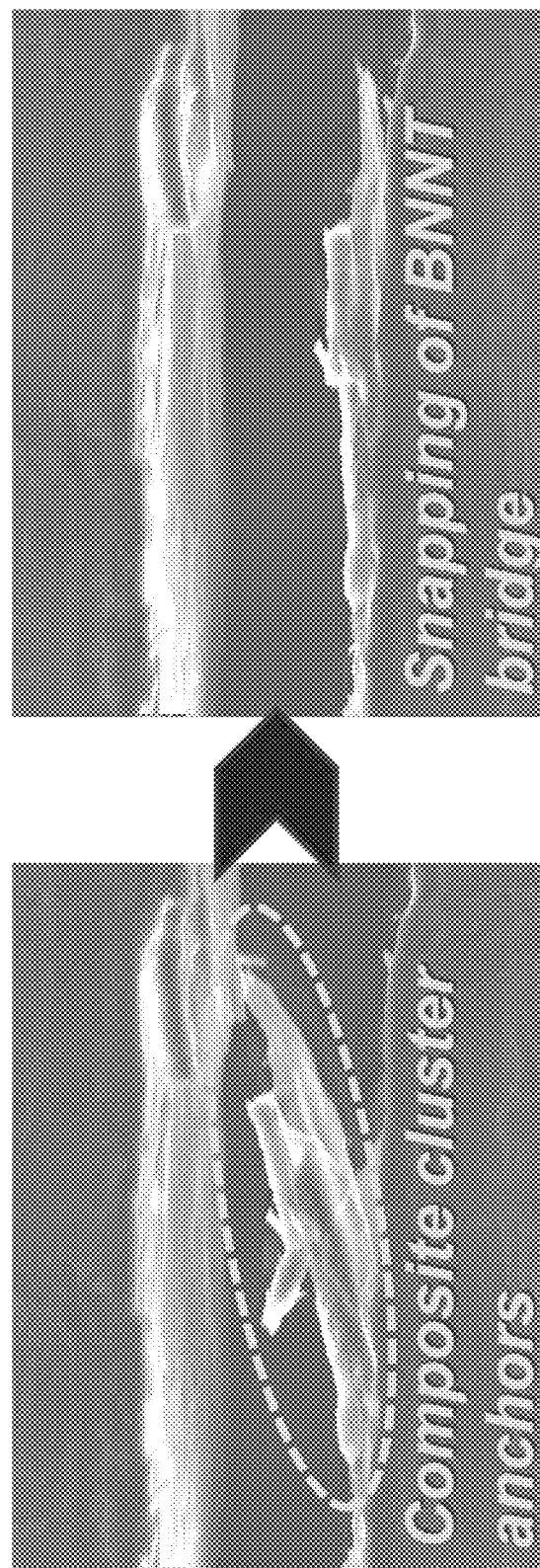
FIG. 4(c) shows SEM images showing snapping of composite cluster acting as interface anchor.
Figure 4D:
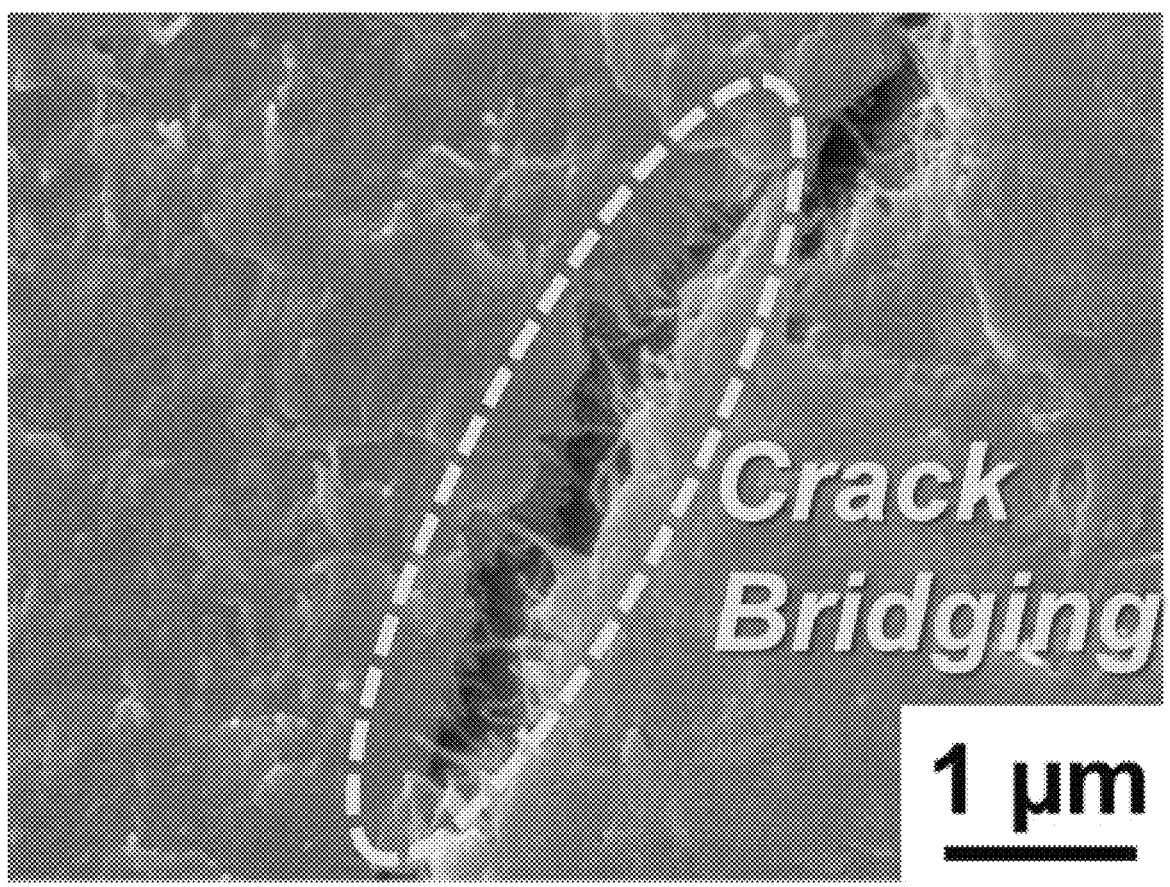
FIG. 4(d) is a post-delamination SEM image showing extensive crack bridging. The scale bar is 1 µm.
Figure 4E:
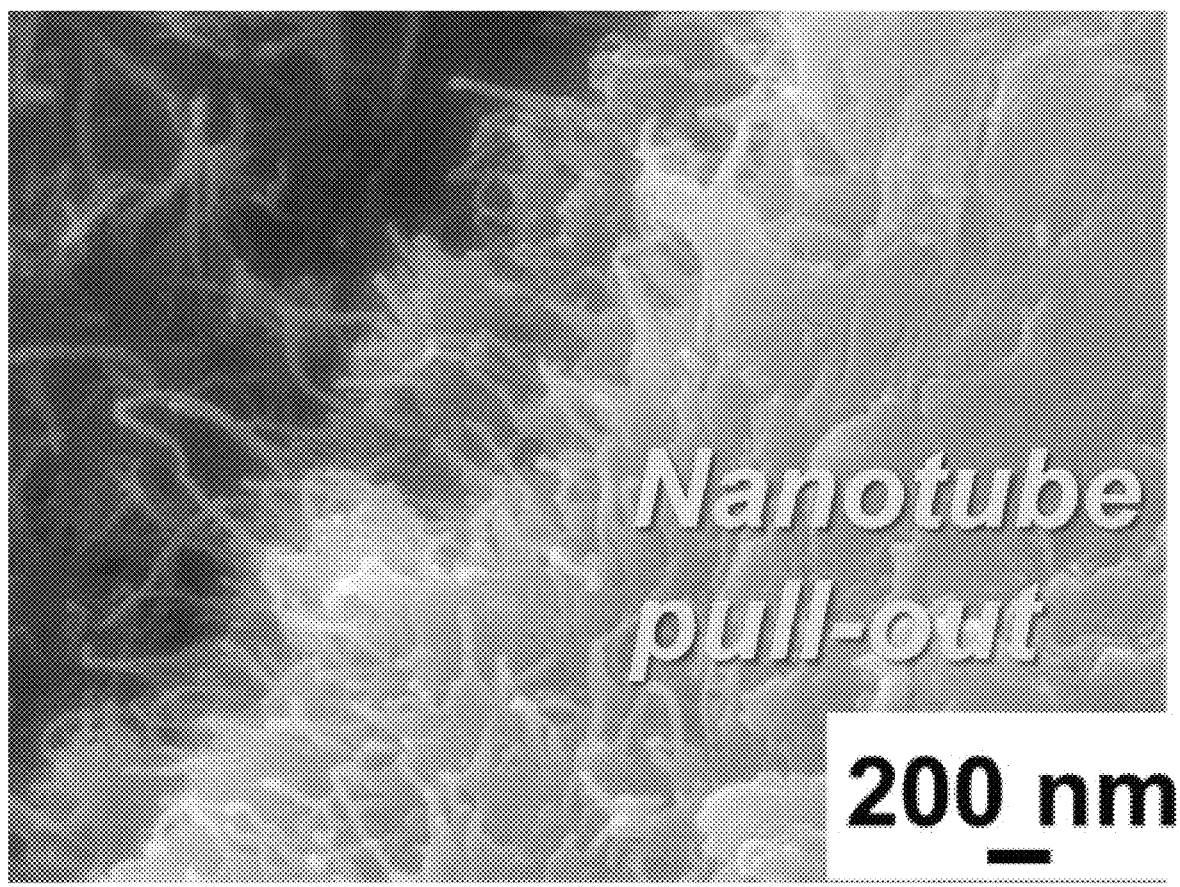
FIG. 4(e) is a post-delamination SEM image showing nanotube pull-out due to mechanical loading. The scale bar is 200 nm.

An in-situ double cantilever experimental setup was used to examine the mechanisms associated with BNNT reinforcement in the sandwich composite prepared in Example 1. A micromechanical stage (MTI SEMtester, Albany, USA) with custom-designed fixtures was used to study failure in the composite, as seen in FIG. 4(a). The test was performed inside the SEM chamber for high-resolution imaging of failure characteristics. Mechanical loading resulted in crack propagation and de-bonding along the composite interface. BNNTs resisted crack opening, evidenced by the stretching and fracture of the nanotubes (see FIG. 4(b)). The AZ31-BNNT composite clusters act as bridges or anchors at the interface, and the crack bridges were observed to undergo re-alignment—from being parallel to the interface before mechanical loading to becoming angled bridges—as the loading progressed. The realignment is advantageous because the nanotubes display load-bearing ability along the axial direction. Further forces were expended on the snapping of these bridges before crack propagation (see FIG. 4(c)). The fracture strength of BNNT is remarkably high (about 30 GPa), which is effectively exploited in this sandwich composite to provide failure resistance. Metal-nanotube clusters broke under continued mechanical loading, and the bridge failure was ductile, evidenced by the slow nanotube pull-out that was observed. After the conclusion of the test, the delaminated surfaces were imaged and extensive crack bridging was observed due to the high-aspect-ratio of the nanotubes (see FIG. 4(d)). FIG. 4(e) shows the pull-out of nanotubes in the delaminated surface, confirming effective stress transfer from the (weaker) metal matrix to the (stronger) nanotubes.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A method of fabricating a boron nitride nanotube (BNNT)-magnesium (Mg) alloy composite, the method comprising:
   providing a mat of BNNTs;
   sputter-coating the mat of BNNTs with Mg to give a sputter-coated mat;
   sandwiching the sputter-coated mat between layers of an Mg alloy; and
   sintering the sputter-coated mat and the Mg alloy to give the BNNT-Mg alloy composite,
   the BNNTs of the BNNT-Mg alloy composite having an aspect ratio of at least 3,000, and
   the BNNT-Mg alloy composite having crack-bridging ability due to the BNNTs of the BNNT-Mg alloy composite resisting crack propagation and crack opening.

2. The method according to claim 1, the crack-bridging ability of the BNNT-Mg alloy composite being further due to chemical bonding between the BNNTs of the BNNT-Mg alloy composite and the Mg alloy of the BNNT-Mg alloy composite.

3. The method according to claim 2, the chemical bonding between the BNNTs of the BNNT-Mg alloy composite and the Mg alloy of the BNNT-Mg alloy composite being due to the sputter-coating of the mat and due to interfacial reactions between the BNNTs of the BNNT-Mg alloy composite and the Mg alloy of the BNNT-Mg alloy composite.

4. The method according to claim 1, the high pressure sintering being spark plasma sintering (SPS) performed at a pressure of at least 400 megaPascal (MPa).

5. The method according to claim 4, the high pressure SPS being performed at a temperature of at least 400° C. and for a time period of at least 10 minutes.

6. The method according to claim 1, the layers of the Mg alloy comprising powder of the Mg alloy.

7. The method according to claim 1, the Mg alloy comprising Mg, aluminum (Al), and zinc (Zn).

8. The method according to claim 1, the Mg alloy being AZ31.

9. The method according to claim 1, the mat of BNNTs comprising a porosity of at least 75%, and
   the BNNTs of the mat of BNNTs having a diameter in a range of from 5 nanometers (nm) to 15 nm and a length of at least 50 micrometers (μm).

10. The method according to claim 1, the sputter-coated mat comprising a layer of Mg on both an upper surface and a lower surface thereof, each layer of Mg having a thickness of at least 1 μm and a purity of Mg of at least 99.9%.

11. The method according to claim 1, the BNNT-Mg alloy composite comprising BNNTs in a range of from 0.5 wt % to 5 wt %.

12. The method according to claim 1, the BNNT-Mg alloy composite comprising:
    a nano-phase of magnesium nitride ($Mg_3N_2$) and a nano-phase of aluminum nitride (AlN) between the Mg alloy and the BNNTs; and
    a hexagonal boron nitride phase in the BNNTs.

13. The method according to claim 1, the Mg alloy comprising about 96 wt % Mg.

14. A method of fabricating a boron nitride nanotube (BNNT)-magnesium (Mg) alloy composite, the method comprising:
    providing a mat of BNNTs;
    sputter-coating the mat of BNNTs with Mg to give a sputter-coated mat;
    sandwiching the sputter-coated mat between layers of an Mg alloy; and
    sintering the sputter-coated mat and the Mg alloy to give the BNNT-Mg alloy composite,
    the Mg alloy comprising about 96 wt % Mg.

15. The method according to claim 14, the BNNTs of the BNNT-Mg alloy composite having an aspect ratio of at least 3,000.

16. The method according to claim 14, the BNNT-Mg alloy composite having crack-bridging ability due to the BNNTs of the BNNT-Mg alloy composite resisting crack propagation and crack opening,
    the crack-bridging ability of the BNNT-Mg alloy composite being further due to chemical bonding between the BNNTs of the BNNT-Mg alloy composite and the Mg alloy of the BNNT-Mg alloy composite, and
    the chemical bonding between the BNNTs of the BNNT-Mg alloy composite and the Mg alloy of the BNNT-Mg alloy composite being due to the sputter-coating of the mat and due to interfacial reactions between the BNNTs of the BNNT-Mg alloy composite and the Mg alloy of the BNNT-Mg alloy composite.

17. The method according to claim 14, the high pressure sintering being spark plasma sintering (SPS) performed at a pressure of at least 400 megaPascal (MPa), and
    the high pressure SPS being performed at a temperature of at least 400° C. and for a time period of at least 10 minutes.

18. The method according to claim 14, the BNNT-Mg alloy composite comprising:
    a nano-phase of magnesium nitride ($Mg_3N_2$) and a nano-phase of aluminum nitride (AlN) between the Mg alloy and the BNNTs; and
    a hexagonal boron nitride phase in the BNNTs.

19. The method according to claim 14, the layers of the Mg alloy comprising powder of the Mg alloy,
    the Mg alloy comprising Mg, aluminum (Al), and zinc (Zn),
    the mat of BNNTs comprising a porosity of at least 75%,
    the BNNTs of the mat of BNNTs having a diameter in a range of from 5 nanometers (nm) to 15 nm and a length of at least 50 micrometers (μm),
    the sputter-coated mat comprising a layer of Mg on both an upper surface and a lower surface thereof, each layer of Mg having a thickness of at least 1 μm and a purity of Mg of at least 99.9%, and
    the BNNT-Mg alloy composite comprising BNNTs in a range of from 0.5 wt % to 5 wt %.

20. A method of fabricating a boron nitride nanotube (BNNT)-magnesium (Mg) alloy composite, the method comprising:
    providing a mat of BNNTs;
    sputter-coating the mat of BNNTs with Mg to give a sputter-coated mat;
    sandwiching the sputter-coated mat between layers of an Mg alloy; and
    sintering the sputter-coated mat and the Mg alloy to give the BNNT-Mg alloy composite,
    the BNNTs of the BNNT-Mg alloy composite having an aspect ratio of at least 3,000,
    the BNNT-Mg alloy composite having crack-bridging ability due to the BNNTs of the BNNT-Mg alloy composite resisting crack propagation and crack opening,
    the crack-bridging ability of the BNNT-Mg alloy composite being further due to chemical bonding between the BNNTs of the BNNT-Mg alloy composite and the Mg alloy of the BNNT-Mg alloy composite,
    the chemical bonding between the BNNTs of the BNNT-Mg alloy composite and the Mg alloy of the BNNT-Mg alloy composite being due to the sputter-coating of the mat and due to interfacial reactions between the BNNTs of the BNNT-Mg alloy composite and the Mg alloy of the BNNT-Mg alloy composite,
    the sintering being high pressure spark plasma sintering (SPS) performed at a pressure of about 400 megaPascal (MPa), a temperature of about 400° C., and for a time period of about 10 minutes,
    the layers of the Mg alloy comprising powder of the Mg alloy,
    the Mg alloy being AZ31,
    the mat of BNNTs comprising a porosity of at least 75%,
    the BNNTs of the mat of BNNTs having a diameter of about 10 nanometers (nm) and a length of at least 75 micrometers (μm),
    the sputter-coated mat comprising a layer of Mg on both an upper surface and a lower surface thereof, each layer of Mg having a thickness of at least 1 μm and a purity of Mg of at least 99.9%,
    the BNNT-Mg alloy composite comprising 1 wt %, and
    the BNNT-Mg alloy composite further comprising:
    a nano-phase of magnesium nitride ($Mg_3N_2$) and a nano-phase of aluminum nitride (AlN) between the Mg alloy and the BNNTs; and
    a hexagonal boron nitride phase in the BNNTs.

* * * * *